US012622311B2

(12) United States Patent　(10) Patent No.: US 12,622,311 B2
Kannan et al.　(45) Date of Patent: May 5, 2026

(54) METHOD FOR ASSEMBLING EIC TO PIC TO BUILD AN OPTICAL ENGINE

(71) Applicant: Avago Technologies International Sales Pte. Limited, Singapore (SG)

(72) Inventors: Sukeshwar Kannan, San Jose, CA (US); Near Margalit, Westlake Village, CA (US); Vivek Raghuraman, San Jose, CA (US); Vivek Raghunathan, Mountain View, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 378 days.

(21) Appl. No.: 18/449,253

(22) Filed: Aug. 14, 2023

(65) Prior Publication Data

US 2025/0062258 A1　Feb. 20, 2025

(51) Int. Cl.
H01L 21/768 (2006.01)
H01L 21/48 (2006.01)
(Continued)

(52) U.S. Cl.
CPC ............ H01L 24/08 (2013.01); H01L 21/486 (2013.01); H01L 21/76898 (2013.01); H01L 23/481 (2013.01); H01L 23/49827 (2013.01); H01L 24/05 (2013.01); H01L 24/80 (2013.01); H01L 2224/05541 (2013.01); H01L 2224/05647 (2013.01); H01L 2224/13144 (2013.01); H01L 2224/13147 (2013.01); H01L 2224/13155 (2013.01); H01L 2224/80357 (2013.01);
(Continued)

(58) Field of Classification Search
CPC ............ H01L 21/486; H01L 21/76898; H01L 23/481; H01L 24/08
See application file for complete search history.

(56) References Cited

U.S. PATENT DOCUMENTS

| 9,704,766 B2 | 7/2017 | Goel et al. |
| 10,365,447 B2 | 7/2019 | Mekis et al. |

(Continued)

FOREIGN PATENT DOCUMENTS

| CN | 113540059 A | 10/2021 |
| TW | M-542244 U | 5/2017 |
| WO | WO-2022-252087 A1 | 12/2022 |

OTHER PUBLICATIONS

Wang, "Microsystems using three-dimensional integration and TSV technologies: Fundamentals and applications," (2019), 8 pages.
(Continued)

*Primary Examiner* — Dale E Page
*Assistant Examiner* — Wilner Jean Baptiste
(74) *Attorney, Agent, or Firm* — Quarles & Brady LLP

(57) ABSTRACT

The current invention offers a method for preparing an electronic integrated circuit (EIC) for the assembly of an optical engine. The method involves stacking a CMOS-based EIC wafer onto a short loop/interposer wafer through face-to-back bonding. This stacked configuration serves as a carrier for the thin CMOS wafers. Subsequently, the stacked wafers are thinned down to the desired height and undergo a via last process. In this process, the thick metal layer from the short loop/interposer wafer acts as an etch stop. The stacked EIC wafers can then be diced and attached to a photonic integrated circuit (PIC) wafer, resulting in the formation of an optical engine.

7 Claims, 11 Drawing Sheets

(51) Int. Cl.
*H01L 23/00* (2006.01)
*H01L 23/48* (2006.01)
*H01L 23/498* (2006.01)

(52) U.S. Cl.
CPC ............... *H01L 2224/80379* (2013.01); *H01L 2224/80447* (2013.01); *H01L 2224/80896* (2013.01); *H01L 2924/05442* (2013.01)

(56) References Cited

U.S. PATENT DOCUMENTS

| | | | |
|---|---|---|---|
| 10,418,350 B2 | 9/2019 | Das et al. | |
| 11,437,332 B2 * | 9/2022 | Chang ................. | H01L 25/0657 |
| 2020/0319403 A1 | 10/2020 | Coolbaugh et al. | |
| 2020/0343218 A1 | 10/2020 | Hu et al. | |
| 2020/0365593 A1 | 11/2020 | Chen et al. | |
| 2020/0402960 A1 | 12/2020 | Chen et al. | |
| 2022/0189941 A1 | 6/2022 | Enquist et al. | |
| 2022/0320299 A1 | 10/2022 | Chen | |
| 2023/0005543 A1 | 1/2023 | Yang et al. | |

OTHER PUBLICATIONS

European Patent Office, Extended Search Report, Application No. 24191485.2, Jan. 9, 2025, 7 pages.

\* cited by examiner

METHOD FOR ASSEMBLING EIC TO PIC TO BUILD AN OPTICAL ENGINE

FIELD OF INVENTION

The subject technology is directed to silicon photonics devices and methods of manufacturing.

BACKGROUND OF THE INVENTION

The progress of high-speed data communication involved in SERDES devices demands further for shorter die to die interconnect path such as using vertical integration techniques to assemble different integrated circuits. For example, optical engines for the high-speed data communication can be built by silicon photonics technology that requires the stacking of electronic integrated circuit (EIC) and photonic integrated circuit (PIC). 3D stacking of silicon photonics offers a range of advantages including enhanced device density, improved performance, and shorter interconnect lengths which can lead to lower power consumption and delay. As technology node continues to push to 7 nm or smaller, some existing assembly flows may experience various technical challenges or limitations. Therefore, improved methods for assembling EIC to PIC are desired and subjects of this application.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figures 1, 2:
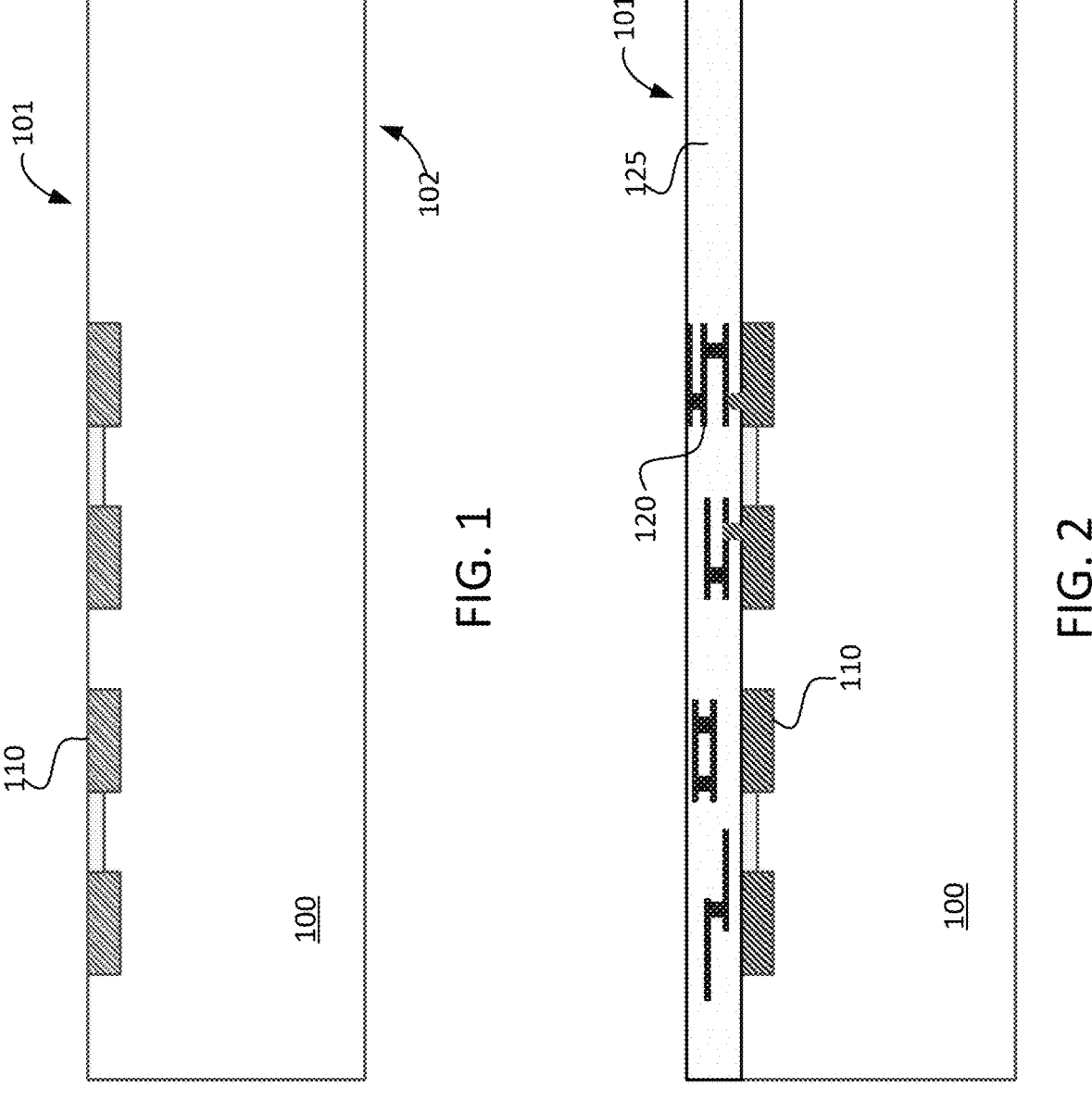
FIG. 1 is a snapshot diagram of a front-end-of-life (FEOL) process step of a method for preparing electronic integrated circuit to build an optical engine according to an embodiment of the subject technology.
FIG. 2 is a snapshot diagram of a middle-of-life (MOL) and back-end-of-line (BEOL) process step of the method for preparing electronic integrated circuit to build an optical engine according to an embodiment of the subject technology.

The current invention relates to semiconductor devices and manufacturing methods. Specifically, it presents a method for preparing an electronic integrated circuit for the assembly of an optical engine. The method involves the hybrid front-to-back bonding of a short-loop (SL) wafer to a thin CMOS wafer. This bonding process creates a two-substrate stack with increased total thickness, which enhances its capability for wafer handling. The bonded SL wafer can then be thinned down to a suitable thickness that allows for the formation of backside deep trenches or through-silicon vias (TSVs). An etch stop is achieved by utilizing a thick metal layer on the front side of the SL wafer. There are other embodiments as well.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the subject technology is not intended to be limited to the embodiments presented, but is to be accorded the widest scope consistent with the principles and novel features disclosed herein.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

In an example, the term "circuit board", including the mentioned "main circuit board" and "sub-sized circuit board", also known as a printed circuit board (PCB), refer a flat, rigid board made of insulating material, typically fiberglass or plastic, that contains a complex network of metallic pathways, or "traces," that form the electrical circuitry for various electronic devices. Components such as resistors, capacitors, and integrated circuits are then mounted onto the board, and their leads are soldered onto the corresponding traces to create a functioning electronic circuit. "Main" or "sub-sized" is mainly referring to a lateral size of the circuit board, which is one of focal features of the present disclosure.

When an element is referred to herein as being "connected" or "coupled" to another element or "contact" to another surface, it is to be understood that the elements can be directly connected to the other element or have intervening elements present between the elements. In contrast, when an element is referred to as being "directly connected" or "directly coupled" to another element or "directly contact" to another surface, it should be understood that no intervening elements are present in the "direct" connection between the elements. However, the existence of a direct connection does not exclude other connections, in which intervening elements may be present. When an element is referred to herein as being "electrically coupled" to another element, it is to be understood that the element can directly connected by an electrical conductor to another element.

When an element is referred to herein as being "disposed" or "positioned" in some manner geometrically relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In particular, regarding the geometric relation, term "on" a base material may generally be referred to being attached to a surface of the base material and term "in" the base material may generally be referred to being within a bulk region (e.g., below the surface) of the base material. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Additionally, when an electrical connection element for chip-to-chip or chip-to-board bonding is referred to herein as being a metal "pillar", it is to be understood that the pillar is a vertical, cylindrical structures that protrude from the substrate or packaging substrate or a surface of a dielectric layer on the substrate. It is typically taller than they are wide, as pillar is general language meaning, and sometime designed with a high aspect ratio with a significant height compared to their width. This provides high-density interconnects and reduces the footprint required for electrical connections. Pillars primarily serve as interconnects for electrical and thermal conduction between different layers or components within a semiconductor device or package. Alternatively, "pad" is referred to as a flat, planar area on the substrate or packaging substrate. "Pad" is typically wider than it is tall and has a larger surface area. It is primarily used as a contact area or a landing pad for wire bonding, soldering, or other bonding techniques. Copper pads are widely used in various semiconductor packaging processes, including traditional wire bonding, tape automated bonding (TAB), and flip-chip bonding. Further, "bump", for example Cu/Ni/Au bump, also known as solder bump or micro-bump, is a structure used for interconnection in semiconductor packaging. A bump may be based on a pad or a pillar. "Bumps" are commonly used in various semiconductor packaging technologies, including flip-chip bonding and chip-to-chip interconnections. Furthermore, each of these electrical connection elements is simply referred to as "electrical contact" or "conductive contact" or just "contact" in the specification or claim, yet it can be any one of the different types or shapes of the elements mentioned above depending on various packaging processes or applications.

A "trench" in a silicon layer refers to a vertical or inclined groove or cavity that is etched or formed within a layer of silicon material. It is a feature that may be created during the fabrication process of semiconductor devices or integrated circuits. For example, the purpose of a trench in a silicon layer can vary depending on the specific application or design requirements. Optionally, trenches can be used to provide electrical isolation between different components or regions on a silicon substrate. Trenches can be utilized to create through-silicon vias (TSVs), which are vertical interconnects that pass through the silicon layer to connect different layers or chips in a 3D integrated circuit (IC) structure. For example, metal contact may partially or fully fill-in contact with sidewalls and bottom surface of the trench—a trench to provide electrical connection. TSVs provide a pathway for electrical signals, power, or heat between different levels or components within the IC. Optionally, trenches can be engineered to induce stress on the surrounding silicon material, altering its electrical properties. The dimensions, depth, width, and aspect ratio of the trench can vary depending on the specific application, device requirements, and semiconductor technology node. The trenches are typically formed through processes such as dry or wet etching, where the silicon material is selectively removed or modified using chemical or plasma-based methods.

Electronic Integrated Circuits, often referred to simply as integrated circuits (ICs), are electronic devices that incorporate multiple electronic components and circuit elements onto a single chip or substrate. These components can include transistors, resistors, capacitors, and interconnects, among others. The EIC technology enables the integration of complex electronic functionalities, such as logic gates, memory cells, analog circuits, or digital signal processing circuits, onto a small semiconductor chip. "electronic circuits" or simply "circuits" may be used here but should be considered to include any component of the EIC. EIC typically is fabricated on silicon wafers or simply referred to as "silicon substrate" including silicon-on-insulator substrate, although other types of substrates may be used.

Photonic Integrated Circuits (PICs) are a type of integrated circuit that focuses on the integration of optical or photonic components and functionalities onto a single chip or substrate. Unlike EICs that primarily handle electronic signals, PICs manipulate and process optical signals, harnessing the properties of light for communication, sensing, or other applications. PICs incorporate optical components such as lasers, waveguides, modulators, photodetectors, and multiplexers onto a chip.

The general packaging of an Electronic Integrated Circuit (EIC) and Photonic Integrated Circuit (PIC) involves the integration and assembly of these two distinct technologies into a single package, enabling their combined functionality and interconnectivity. The packaging process ensures the protection, electrical connections, and mechanical stability of the integrated circuits while facilitating their interaction with the external world.

The EIC and PIC chips, which have been fabricated separately, are prepared for packaging. A suitable substrate or carrier material is chosen for mounting the EIC and PIC chips. Common substrate materials include semiconductors (like Si or others), ceramics, organic laminates, or specialized materials with desirable electrical and thermal properties. The EIC and PIC chips are bonded onto the substrate using techniques such as flip-chip bonding or adhesive bonding. This ensures secure attachment and establishes electrical connections between the chips and the substrate. Wire bonding or flip-chip interconnects are used to establish electrical connections between the EIC and PIC chips and the substrate. Wire bonding involves attaching tiny wires between bonding pads on the chips and corresponding pads on the substrate. Flip-chip interconnects utilize solder bumps or metal bumps on the chips that directly connect with corresponding pads on the substrate. For example, a metal bump, as used in a flip chip, refers to a small metal bump that is deposited on the die surface to provide electrical connections, and it should not limit the scope of claims. The wafer is then diced, and those dies are flipped and positioned so the solder balls align with the substrate pads 1. The Standard FlipChip process uses premixed solder paste for the solder bumps which provides for outstanding control of the alloy composition across the entire wafer 23.

The bonded chips and interconnects are encapsulated with a protective material, such as epoxy or a resin-based compound. External interconnects are established to connect the packaged EIC and PIC to the external world. These interconnects can include wire bonds, solder balls, or other suitable connection methods. They provide electrical pathways for power, signals, and data transmission to and from the packaged integrated circuits. The packaged EIC and PIC are typically mounted onto a larger carrier or substrate, such as a printed circuit board (PCB) or a module, to facilitate integration into larger systems or electronic devices. The specific packaging techniques, materials, and interconnect methods may vary depending on the specific requirements of the EIC and PIC, as well as the targeted applications. Advanced packaging technologies, such as system-in-package (SiP) or multi-chip modules (MCMs) or 3D stacking of silicon photonics, may be employed to further enhance integration and functionality.

Moreover, the terms left, right, frontside, backside, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes an integrated circuit. The integrated circuit includes a first substrate may include a first side and a second side. The circuit also includes a circuit disposed on the first side. The circuit also includes a first dielectric layer positioned on the circuit, the first dielectric layer may include a first surface. The circuit also includes a second dielectric layer positioned on the second side, the second dielectric layer may include a second surface. The circuit also includes a first metal layer embedded in the first dielectric layer, the first metal layer being coupled to the circuit. The circuit also includes a second metal layer positioned on the first surface, the second metal layer being coupled to the first metal layer. The circuit also includes a first contact coupled to the second metal layer. The circuit also includes a via may include a first end and a second end, the first end being coupled to the first metal layer and a second end being positioned on the second surface and coupled to the second dielectric layer. The circuit also includes a second substrate may include a third side and a fourth side. The circuit also includes a third dielectric layer positioned on the third side, the third dielectric layer may include a third surface. The circuit also includes a third metal layer positioned on the third dielectric layer. The circuit also includes a second contact coupled to the third metal layer and positioned on the third surface, the second contact being coupled to the second end of the via, the second surface being contacted with the third surface. The circuit also includes a fourth metal layer positioned on the fourth side and on sidewalls of a trench through the second substrate to couple to the third metal layer at a bottom of the trench. The circuit also includes a third contact coupled to the fourth metal layer.

Implementations may include one or more of the following features. The integrated circuit where the first contact may include a metal bump configured to couple to an electrical contact on a printed circuit board. The first substrate may include a silicon wafer with a first thickness in a range of 10 to 12 um. The second substrate may include a silicon wafer with a second thickness of 75 um or greater. The second contact may include a metal pad. The integrated circuit may include a two-substrate stack formed by dielectric bonding between the second dielectric layer and the third dielectric layer and metal bonding between the metal pad and the second end of the via. For example, "metal pad" refers to small area of metal that is used to make an electrical connection between two different parts of an integrated circuit, and different shapes and metal materials may be used. The third contact may include a metal pillar with a solder cap configured to couple to an electrical contact of a photonic integrated circuit on a third substrate. The third contact may include a copper pillar configured to couple to an electrical contact on a photonic integrated circuit.

Another general aspect includes a method for processing an integrated circuit. The method includes providing a first substrate may include a first side and a second side. The method also includes forming a circuit on the first side. The method also includes forming a first dielectric layer on the circuit and the first side, the first dielectric layer may include a first surface. The method also includes forming a first metal layer embedded in the first dielectric layer, the first metal layer being coupled to the circuit. The method also includes forming a second metal layer on the first surface, the second metal layer being coupled to the first metal layer. The method also includes forming a first contact coupled to a second metal layer on the first surface. The method also includes forming a via may include a conductive material, the via may include a first end and a second end, the first end being coupled to the first metal layer, the second end being positioned at a first depth into the first substrate; processing the second side to position the second end at a same level with a second surface of a second dielectric layer on the second side. The method also includes providing a second substrate that may include a third side and a fourth side. The method also includes forming a third metal layer on the third side. The method also includes forming a third dielectric layer on the third metal layer and the third side, the third dielectric layer may include a third surface. The method also includes forming a second contact coupled to the third metal layer, the second contact being at a same level with the third surface. The method also includes coupling the third surface to the second surface to bond the second substrate to the first substrate. The method also includes forming a trench from the fourth side into the second substrate with a bottom positioned at a second depth, the bottom being the third metal layer. The method also includes forming a first polyimide layer on a sidewall of the trench and the fourth side. The method also includes forming a fourth metal layer on the first polyimide layer on the sidewall of the trench and the fourth side, the fourth metal layer being coupled to the third metal layer positioned at the bottom of the trench. The method also includes forming a second polyimide layer overlying the fourth metal layer to fill the trench. The method also includes forming a third contact coupled to the fourth metal layer om the second polyimide layer on the fourth side.

Implementations may include one or more of the following features. The method where the first contact may include a Cu/Ni/Au bump, may include coupling the Cu/Ni/Au bump to an electrical contact on a printed circuit board. Processing the first backside may include: coupling a carrier substrate to the first side by a glue material, the glue material been applied on the first contact and the first surface of the first dielectric layer on the first side; and thinning the first substrate to make the second side positioned at 5 to 10 um above the second end of the via. The second dielectric layer may include the layer of oxide material and the layer of nitride material. The method may include thinning the second substrate from the fourth side by dry polishing. The method may include debonding the carrier substrate from the first side of the first silicon substrate by laser to expose the first contact on the first surface, the first contact being configured to couple to an electrical contact on a printed circuit board. The coupling the third surface to the second surface may include: aligning the second contact to the second end of the via; forming dielectric bonding between the second dielectric layer and the third dielectric layer as the third surface is in contact with the second surface at a first temperature; forming metal bonding between the second contact and the second end of the via by annealing the second substrate and the first substrate at a second temperature, the second temperature being higher than the first temperature; and forming a two-substrate stack. The forming the trench from the second backside into the second substrate may include: etching from the fourth side to form a trench with an initial depth; depositing a first polyimide layer at least on the sidewall of the trench and on the fourth side; and repeating the etching and the depositing alternately to increase depth of the trench from the initial depth to the second depth until the etching is stopped by the third metal layer.

Yet another general aspect includes a method for stacking an electronic integrated circuit to a photonic integrated circuit. The method includes providing a first substrate may include a first side and a second side, the first side comprising an electronic circuit coupled to a first metal layer in a first dielectric layer, a first contact coupled to a second metal layer positioned at a same level with a first surface of the first dielectric layer, and a via that may include a conductive material coupled to both the first metal layer and the second metal layer, the via may include a first end positioned at the first metal layer and a second end positioned at a first depth into the first substrate, the second side comprising a second dielectric layer, the second dielectric layer comprising a second surface being positioned at a same level with the second end of the via. The method also includes providing a second substrate may include a third side and a fourth side, the third side comprising a second contact coupled to a third metal layer in a third dielectric layer, the second contact being positioned at a third surface of the third dielectric layer. The method also includes coupling the second substrate to the first substrate such that the second contact is coupled to the conductive material in the second end of the via. The method also includes forming a trench from the fourth side into the second substrate, the trench may include a bottom positioned at a second depth, the bottom being the third metal layer. The method also includes forming a fourth metal layer on the fourth side and a sidewall of the trench to couple to the third metal layer at the bottom of the trench. The method also includes forming a third contact coupled to the fourth metal layer, the third contact being configured to couple to an electrical contact of a photonic integrated circuit on a third substrate.

Implementations may include one or more of the following features. The method may include coupling the first surface to a carrier substrate and thinning the first substrate down from the second side to reduce a first thickness of the first substrate no smaller than the first depth of the via. Coupling the second substrate to the first substrate may include forming dielectric bonding between the third dielectric layer and the second dielectric layer by pressing the third surface to contact with the second surface at a first temperature, forming metal bonding between the second contact to the conductive material in the second end of the via by annealing at a second temperature, the second temperature being higher than the first temperature; and thinning the second substrate from the fourth side to reduce a second thickness of the second substrate no smaller than the second depth. The method may include forming a first polyimide layer on the second backside and the sidewall of the trench; forming the fourth metal layer overing the first polyimide layer and to couple to third metal layer at the bottom of the trench; and forming a second polyimide layer overlying the fourth metal layer.

For the purpose of building optical engines, electronic integrated circuit (EIC) or (or simply integrated circuit, or "IC") needs to be prepared first. The incoming EIC wafers from the foundry are typically full thickness and need to go through several backside wafer processing steps before assembly. The wafer processing steps vary based on the technology node of the wafers and assembly process used to build the optical engines. For example, using through silicon vias (TSVs) by via-last or via middle approach is a primary way to prepare the EIC for stacking with photonic integrated circuit (PIC). For example, a via last approach may need via to be larger in size, which requires an etch stop layer in the lower back-end-of-line (BEOL) metal layer that is thick enough to withstand the metal consumption during the etching process. In advanced technology nodes (such as 7 nm node) the BEOL layers are as thin as in the order of 32 nm thickness which will get completely etched away in the TSV last process. Etching all the way to a thick metal layer results in BEOL reliability issues such as cracks in the ultra-low-k dielectrics. So, the existing approaches for via last process becomes incompatible with the latest chip technology advance.

Alternatively, via middle approach can be tailored to integrate at any BEOL layer at the foundry. But the TSV diameter is directly proportional to the mechanical stress and usually comes with specific keep out zone (KOZ) rules. Larger TSV also has Cu overburden that needs double anneal process and CMP to planarize. Scaling TSV aspect ratio directly impacts the silicon thickness and downstream assembly process. For 7 nm and below with TSVs the silicon substrate thickness is down to <10 um. 3D stacking this EIC to PICs and attaching it to circuit board is a challenge as the thin silicon causes the dies to warp and might crack when bond force is exerted.

Some existing approaches is to use fan-out wafer-level packaging for assembling EIC with PIC to build optical engines. It needs fully processed EICs to be reconstituted on fan-out wafers with bottom side redistributed layer (RDL) and through mold vias (TMVs). Then the frontside RDL layers are processed, bumped and ready for assembly. However, this approach increases the die size of the EIC as all connections to the substrate have through the TMVs on the edges of the EIC. It may also bring issues of die warpage due to polyimide layer imbalance of the dual sided RDL layers.

In the present disclosure, improved methods for preparing the EICs before stacking with the PICs for building optical engines is proposed. In a specific embodiment, the EICs are electronic integrated circuits (ICs) based on complementary metal-oxide-semiconductor (CMOS) manufacturing processes. A CMOS wafer with TSVs is prefabricated from the foundry. The CMOS wafer then is hybrid bonded to an intermediate wafer using face-to-back bonding to form a two-wafer stack. The intermediate wafer acts as a carrier for the thin CMOS wafer. The two-wafer stack is then thinned down to the required height and undergoes the TSV last process where the etch stop is done using the thick metal layer preformed from the intermediate wafer. The stacked dies, which are strengthened based on the two-wafer stack, can then be diced and attached to PIC dies for forming the optical engines.

In some embodiments, methods for preparing electronic ICs before stacking with photonic ICs for building optical engines are illustrated below using a series of snapshot diagrams of key process steps. FIG. 1 is a block diagram of a front-end-of-life (FEOL) process step of a method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. The electronic integrated circuit (EIC) is in general based on a silicon substrate 100. In a specific embodiment, the silicon substrate 100 is introduced as an incoming blanket Si wafer having a frontside 101 and a backside 102. The silicon substrate 100 is also referred to as a first substrate. The front side 101 is also referred to as a first side and the backside 102 is also referred to as a second side opposite to the first side. One or more electronic circuits 110 associated with the EIC are fabricated on the frontside 101 following a front-end-of-life process.

As an example, front-end-of-life (FEOL) process in semiconductor manufacturing refers to initial stages of IC fabrication, where the semiconductor wafer is processed to create the transistor devices and their associated components. After wafer cleaning, the substrate surface (at frontside 101) is prepared for subsequent processing steps including growing or depositing a thin layer of dielectric material, applying photoresist, photolithography, etching to selectively removing material at exposed areas, doping to modify electrical properties of semiconductor material, thermal processing, metal deposition to form interconnects, and planarization to ensure a flat and smooth surface wherein the electronic circuits are embedded in, as shown in FIG. 1.

FIG. 2 is a snapshot diagram of a middle-of-life (MOL) and back-end-of-line (BEOL) process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. The FEOL process (FIG. 1) sets the foundation for the creation of semiconductor devices, forming the transistors, interconnects, and essential components on the wafer. It is followed by middle-of-line (MOL) process and back-end-of-line (BEOL) process, where further interconnects, packaging, and testing are performed to complete the semiconductor devices. MOL contacts are a critical component in semiconductor manufacturing that serve as vertical electrical connections between different metal layers in the EIC. These contacts provide the means for signal propagation and interconnection between various components on the EIC. In some embodiments, the snapshot illustration shown in FIG. 2 also includes results from back-end-of-life (BEOL) processes to form interconnect or wiring to couple the electronic circuits to complete EIC at the front side 101 of the silicon substrate 100. As shown in FIG. 2, on the frontside 101, several metal layers are formed to extended to multiple locations in 2D planes and connected by vias in vertical direction on top of the electronic circuits 110 formed earlier. These metal layers and vias are denoted in general by numerical 120 and configured as metal routing layers to couple to the electronic circuits 110. Typically, the metal material in the metal layer and via comprises copper, but it is to be understood other materials may be used as well, including metal alloys, depending on the application. After the metal layers, a low-k dielectric material is deposited onto the wafer surface. For example, dielectric material refers to is an electrical insulator that can be polarized by an applied electric field; a low-k dielectric a material with a small κ (less than 4) that reduces the parasitic capacitance and crosstalk between interconnects. As an example, a dielectric layer may comprise one or more layers of dielectric materials. This dielectric layer serves as an insulating material between the metal layers. In FIG. 2, this dielectric layer is represented by a first dielectric layer 125 on the first side 101. For example, the first dielectric layer is silicon oxide ($SiO_2$). The processes of formation may involve dielectric deposition, via patterning, etching, linear deposition (for barrier or adhesion promotor between metal layers), seed layer deposition, metal electroplating, and chemical mechanical polishing (CMP).

Figure 3:
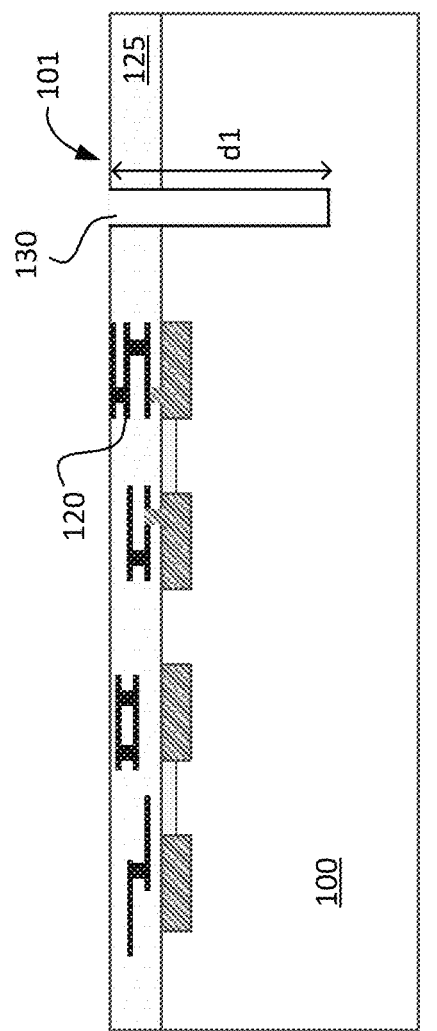
FIG. 3 is a snapshot diagram of a through-silicon via (TSV) integration process step of the method for preparing electronic integrated circuit to build an optical engine according to an embodiment of the subject technology.

FIG. 3 is a snapshot diagram of a through-silicon via (TSV) integration process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. At the end of BEOL process, a last metal (Cu) layer of the metal routing layers 120 may be formed at the surface of the frontside 101. A through-silicon via 130 can be formed in a via-middle process from the surface of the frontside 101 with a depth d1 into the silicon substrate 100, intending for forming an interconnect for the EIC. This through-silicon via is characterized by a high aspect ratio, such as 20:1 or higher, based on advanced etching techniques including deep-reactive ion etching, inductively coupled plasma etching, cryogenic etching, etc. Thedepth d1 may be as large as 10 um, corresponding to a diameter of 0.5 um or smaller.

Figure 4:
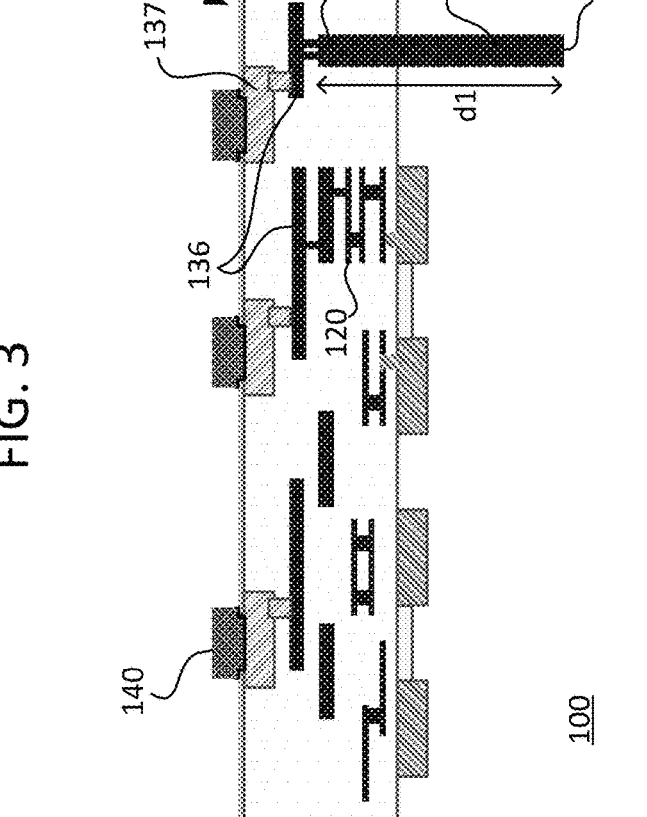
FIG. 4 is a snapshot diagram of a BEOL and frontside contact formation process step of the method for preparing electronic integrated circuit to build an optical engine according to an embodiment of the subject technology.

FIG. 4 is a snapshot diagram of a BEOL and frontside contact formation process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. FIG. 4 shows a process to fill a conductive material 135 into the through-silicon via 130. The conductive material 135, typically Cu, is at least partially added into through-silicon via 130 to form an interconnect with a first end 135A at the surface and a second end 135B into the silicon substrate 100. Further, additional BEOL process is performed on the surface to form additional metal routing layers including a first metal layer 136 embedded in the first dielectric layer 125. The first metal layer 136 is configured to couple to the first end 135A of the interconnect which is also coupled to the metal routing layer 120 formed in previous MOL+BEOL processes. The additional BEOL process also adds the first dielectric layer 125' to have a first surface above the first metal layer 136 and further forms a second metal layer 137 embedded in the first surface of the first dielectric layer 125'. A first conductive contact 140 can be formed on the second metal layer 137 protruded above the first surface. This is the conductive contact formed at the frontside 101 with an intention for coupling electrical contacts on a circuit board when mounting the EIC chip for building the optical engine. In an implementation, the second metal layer 137 is made from aluminum by electroplating. The first conductive contact 140 may be formed as a Cu/Ni/Au bump. The processes of formation involve photoresist application to mask the surface of the second metal layer 137, patterning to form an exposed area, metal deposition of a Cu layer onto the exposed area by PVD or electroplating, metal deposition of Ni to form a barrier layer on the Cu layer, and metal deposition of Au layer on top to provide good electrical conductivity and serve as a protective layer. Although the Cu/Ni/Au bump eventually will be used for mounting EIC to a circuit board, yet the soldering material, e.g., Sn or Ag, is not applied on top thereof. After forming the Cu/Ni/Au bump, a passivation layer may be added overlying the frontside 101. The passivation layer, in an embodiment, includes a silicon nitride layer and/or a silicon dioxide layer.

Figure 5:
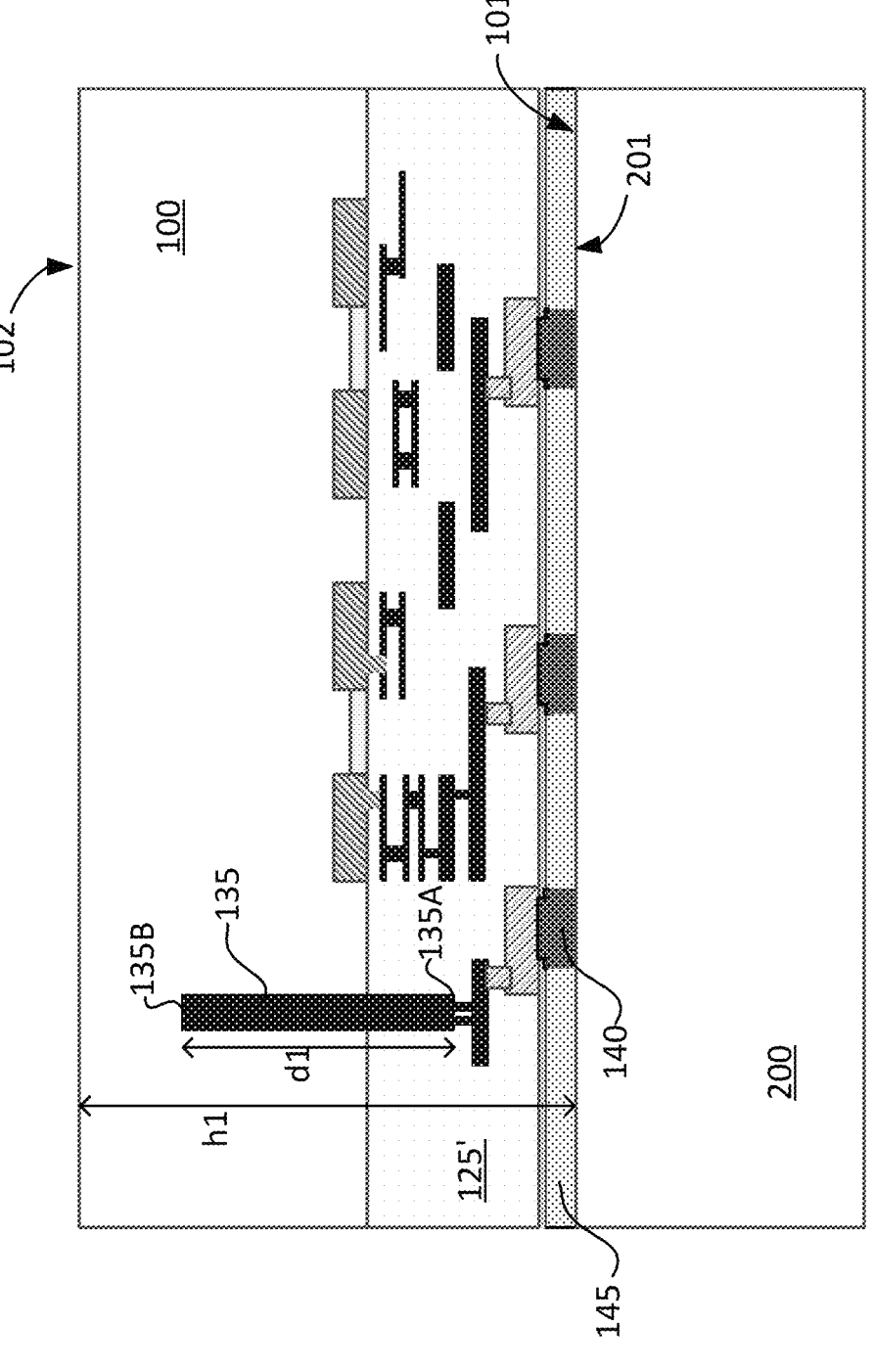
FIG. 5 is a snapshot diagram of a frontside carrier bond and flip wafer process step of the method for preparing electronic integrated circuit to build an optical engine according to an embodiment of the subject technology.

FIG. 5 is a snapshot diagram of a frontside carrier bond and flip wafer process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. FIG. 5 shows a process to flip the first silicon substrate 100 to bond the frontside 101 to a surface 201 of a carrier substrate 200. Before the bonding, a thin layer of silicon dioxide ($SiO_2$) 145 is grown on the surface of the frontside 101, e.g., as a passivation layer that covers the first surface of the first dielectric layer 125' and first conductive contact 140 (e.g., Cu/Ni/Au bump). This thin layer of silicon dioxide 145 can be applied using a rapid thermal processing (RTP) system. The oxide layer acts as an insulating layer and promotes bonding. Optionally, a glue material, such as epoxy-based adhesives or polyimides, may be applied on the first surface to enhance bonding between the carrier substrate and the first substrate. Then, the silicon substrate 100 and the carrier substrate (typically a glass wafer) are pressed together at a first temperature (e.g., room temperature) to execute dielectric bonding (e.g., an anodic bonding) in a chamber with suitable pressures, typically in the range of a few hundred to a few thousand Pascals. For example, dielectric bonding refers to a process of bonding two materials together using a dielectric material, and it is understood that other types of bonding are mechanisms and methods are possible as well. The dielectric material is typically an oxide or nitride that is deposited on the surface of the wafer and then bonded to another wafer using heat and pressure.

Dielectric bonding is used in many applications in semiconductor manufacturing, including wafer-level packaging, MEMS devices, and 3D integration. Furthermore, an annealing process at a second temperature (e.g., at a range of 300-450° C.) is performed to promote the migration of ions across interface and facilitates the formation of a strong bond between the silicon substrate and the carrier substrate. Now the backside 102 of the silicon substrate 100 is on top to allow any backside process to be performed. The silicon substrate has a thickness h1 (typical >200 um) and the through-silicon via 135 filled with conductive material is just about 10-12 um in depth d1.

Figure 6:
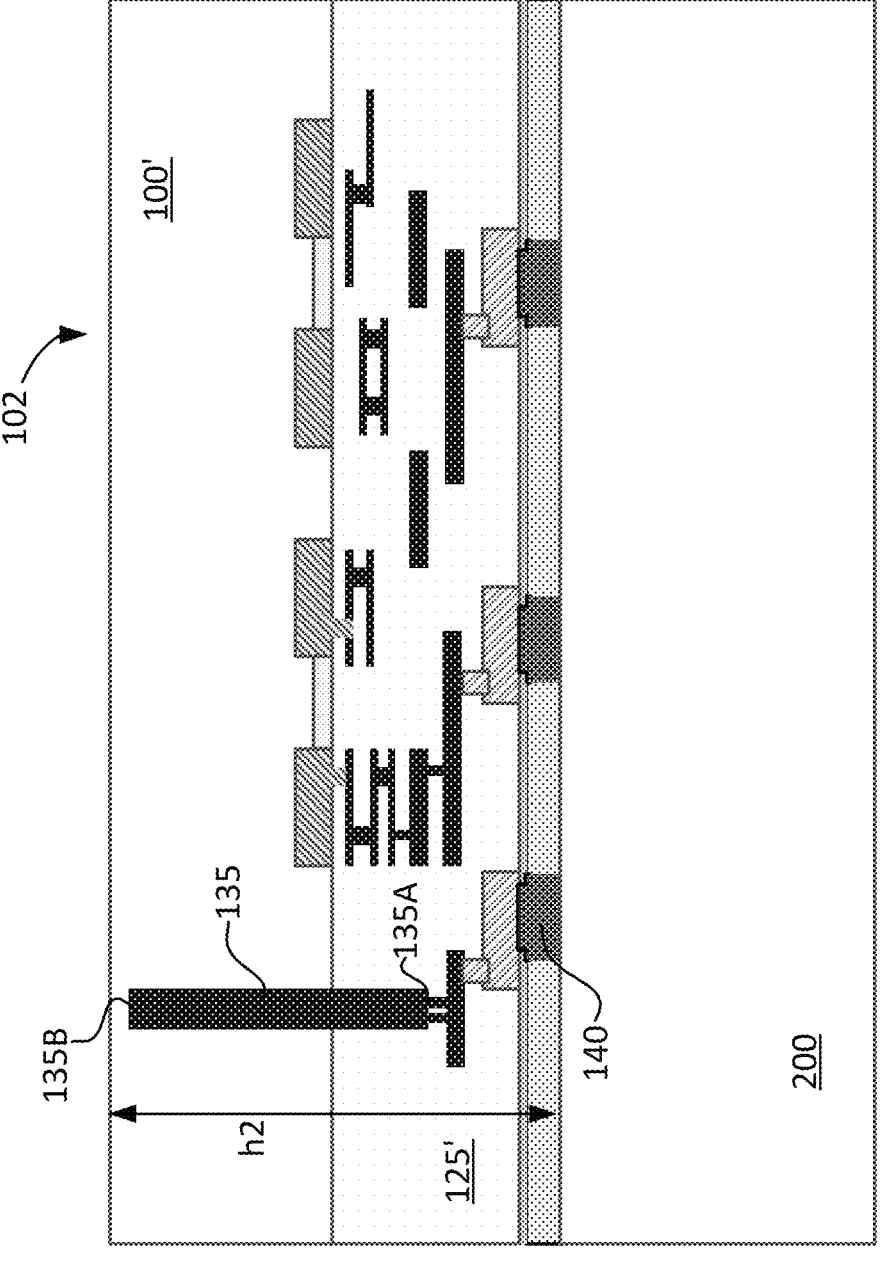
FIG. 6 is a snapshot diagram of a backside dry polish process step of the method for preparing electronic integrated circuit to build an optical engine according to an embodiment of the subject technology.

FIG. 6 is a snapshot diagram of a backside dry polish process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. Using the carrier substrate 200 as a handle substrate, the silicon substrate 100 can be thinned down from the backside (i.e., second side) 102. FIG. 6 shows that the thickness of silicon substrate 100' is down from h1 to h2. Optionally, the thinning process is performed by dry polishing to have the thickness h2 reduced to about 20 um and make the backside 102 to be just at 5 to 10 um above the second end 135B of conductive material in the through-silicon via 135 while using the carrier substrate 200 as a handle substrate. As an example, thinning process can be performed in various ways, such as mechanical grinding, chemical mechanical polishing (CMP), plasma etching, and/or others. Without bonding the carrier substrate, thinning the silicon substrate 100' directly to low tens of micrometers may risk causing substrate warping or cracking.

Figure 7:
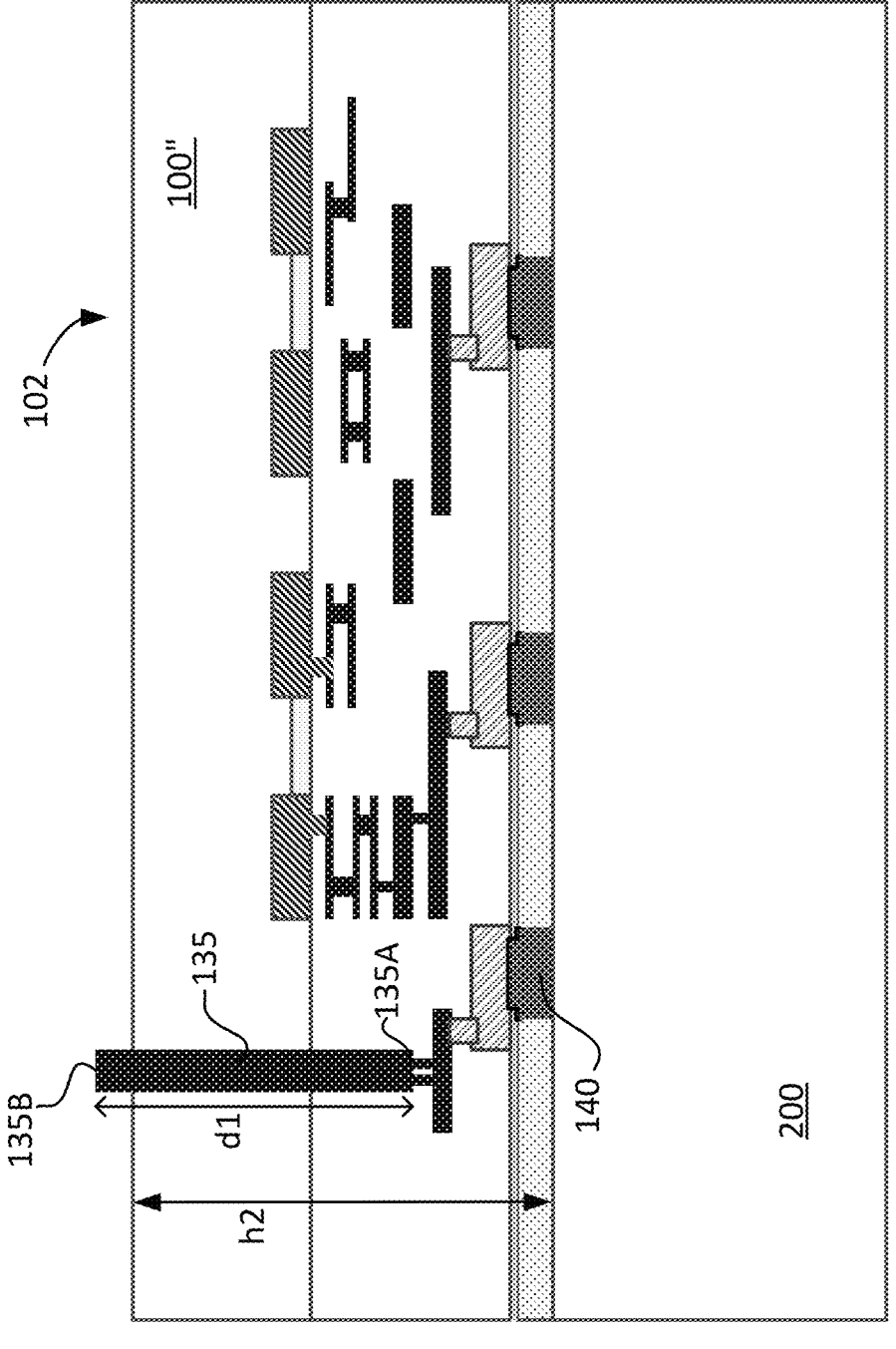
FIG. 7 is a snapshot diagram of a backside Si recess etching process step of the method for preparing electronic integrated circuit to build an optical engine according to an embodiment of the subject technology.

FIG. 7 is a snapshot diagram of a backside Si recess etching process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. Using the carrier substrate as a handle substrate, the backside (second side) 102 of the silicon substrate 100' can be processed further to do a Si recess etching to reveal the second end 135B of the conductive material 135 in the though-silicon via. FIG. 7 shows the second end 135B of the conductive material 135 is protruded out of a (new) surface at the backside 102 of the silicon substrate 100" after the recess etch process to selectively make the silicon around the conductive material (e.g., Cu) lower to a desired recess depth. The recess etching process may use dry etching techniques like reactive ion etching or wet etching technique like potassium hydroxide etching.

Figure 8:
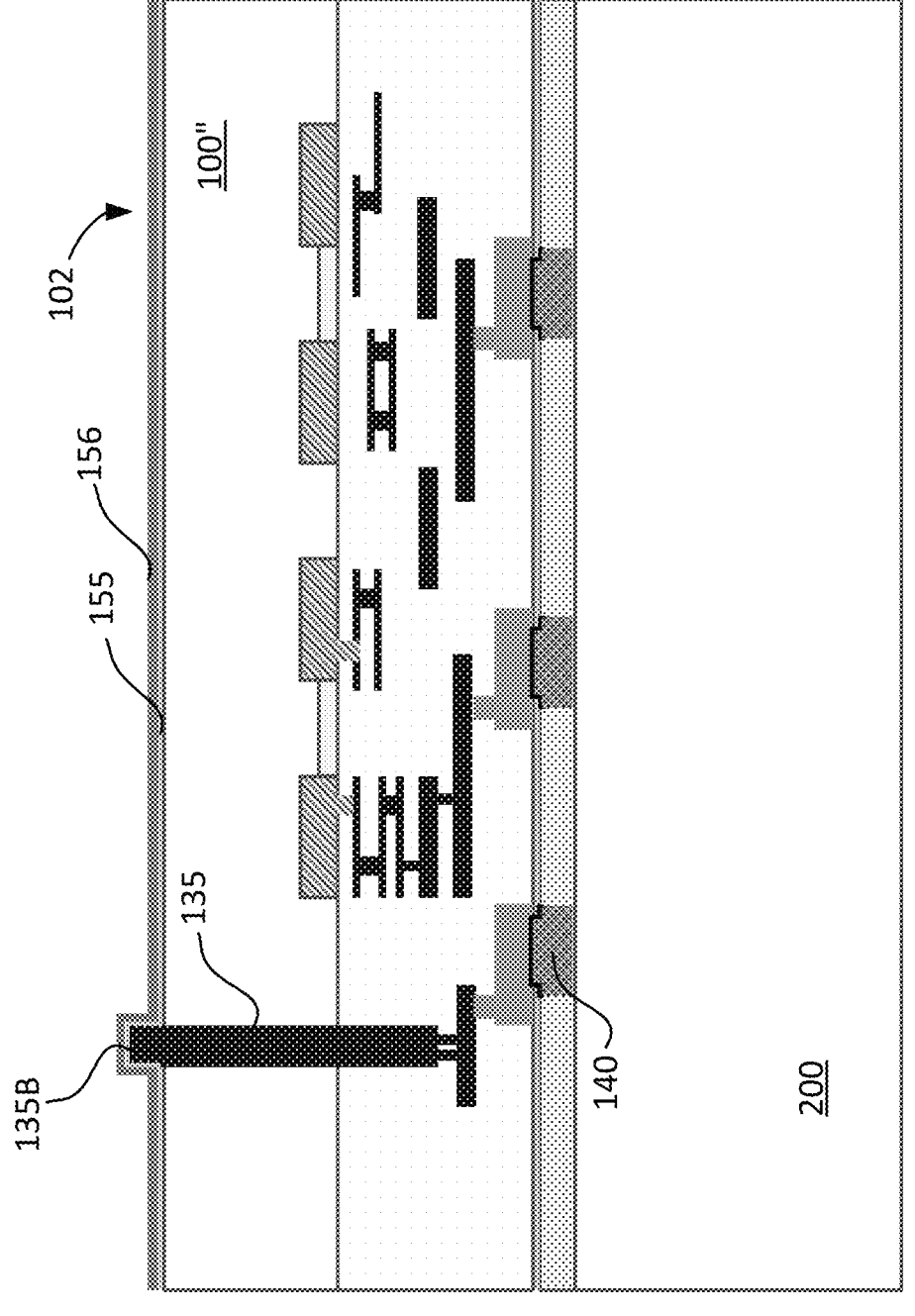
FIG. 8 is a snapshot diagram of a backside passivation process step of the method for preparing electronic integrated circuit to build an optical engine according to an embodiment of the subject technology.

FIG. 8 is a snapshot diagram of a backside passivation process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. Using the carrier substrate as a handle substrate, the backside (second side) 102 of the silicon (first) substrate 100" is further processed to form a passivation layer overlying the backside with the protruded conductive material at the second end 135B. Optionally, the passivation layer includes one or more dielectric materials. For example, firstly, it includes a silicon nitride ($Si_3N_4$) layer 155, or it further is followed by a silicon dioxide ($SiO_2$) layer 156 at the top-most surface. This passivation layer, which is also referred to as a second dielectric layer in this application, helps to ensure the integrity and reliability of the interconnect on the surface at backside 102. The exposed silicon is shielded by the passivation layer from environmental factors, preventing oxidation and minimizing the risk of surface contamination. The passivation layer also prevents electrical short circuits between neighboring interconnects or with other conductive elements.

Figure 9:
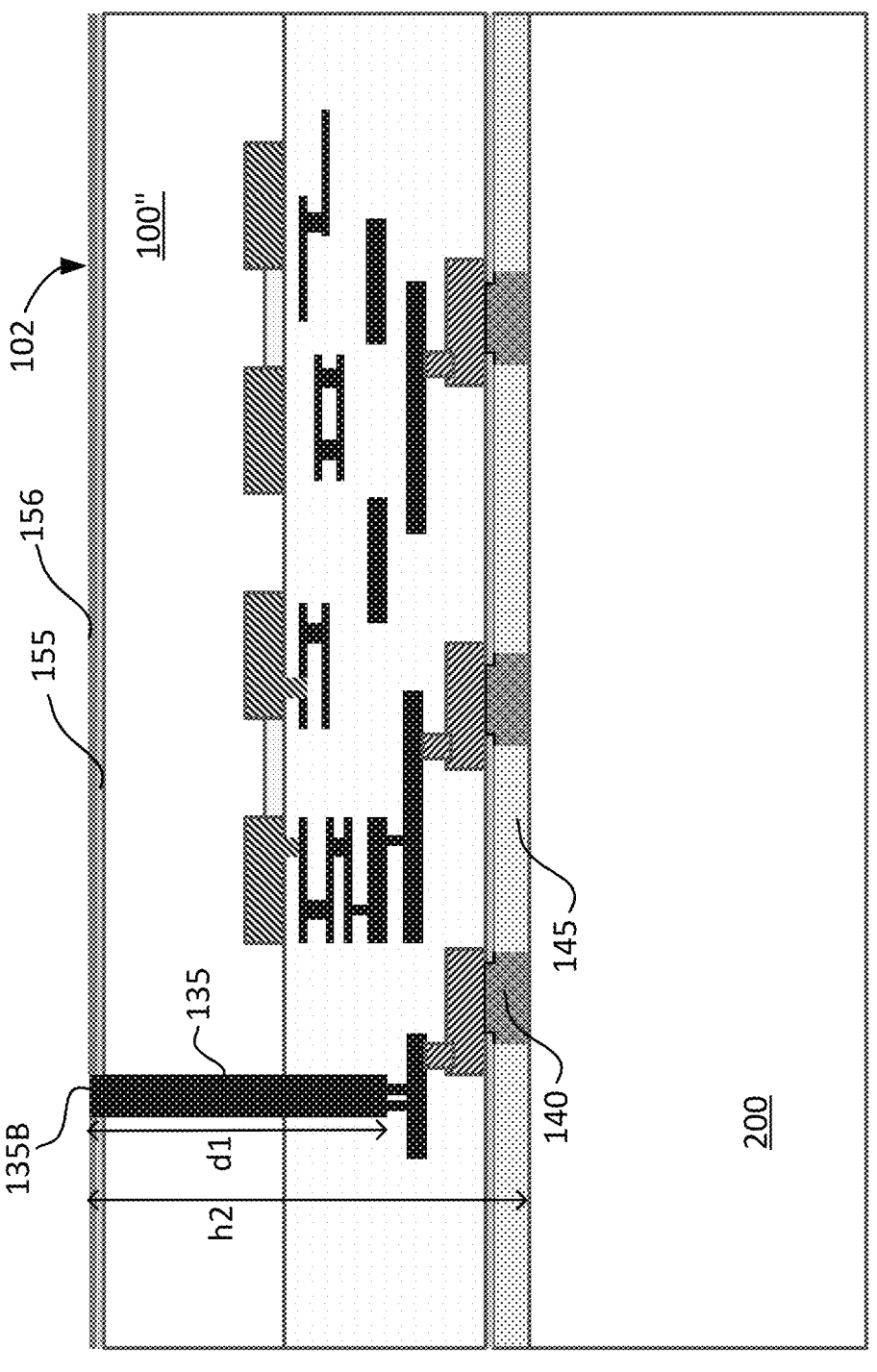
FIG. 9 is a snapshot diagram of a backside chemical-mechanical polish (CMP) process step of the method for preparing electronic integrated circuit to build an optical engine according to an embodiment of the subject technology.

FIG. 9 is a snapshot diagram of a backside chemical-mechanical polish (CMP) process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. The backside 102 is further performed a chemical mechanical polishing (CMP) process to make the second end 135B of the conductive material of the through-silicon via to be flushed with the surface of the passivation layer 156 at the backside 102. As shown in FIG. 9, the silicon (first) substrate (a target wafer) with the through-silicon via as 3D interconnect 135 has a thickness h2 only 10-12 um and is highly susceptible to cracks if there is no support from carrier substrate 200. Interconnect 135 has its second end 135B being exposed at the backside 102 to make it available to couple with an interposer wafer which is introduced in next process step.

Figures 10, 11:
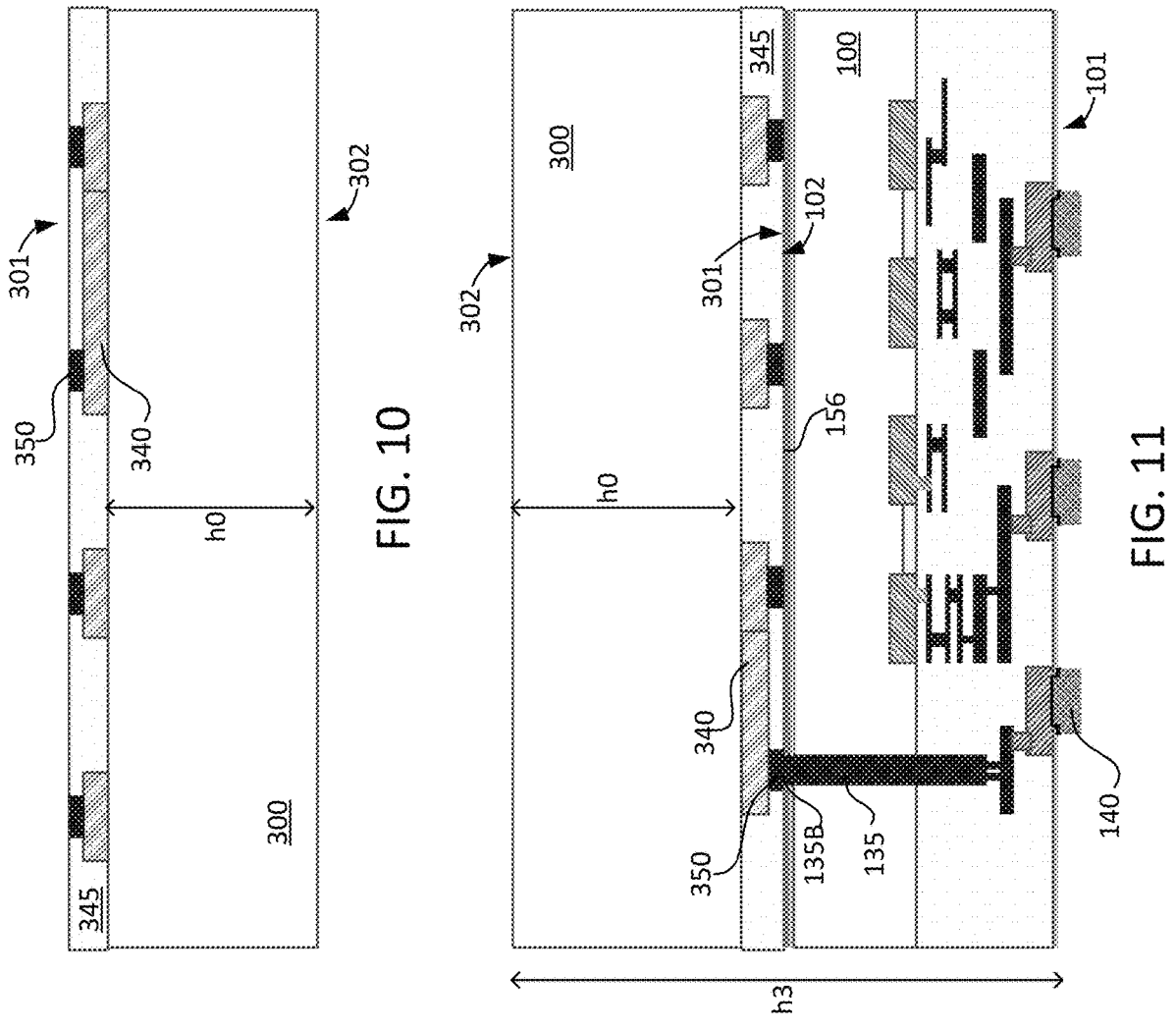
FIG. 10 is a snapshot diagram of a step of providing a short-loop/interposer wafer of the method for preparing electronic integrated circuit to build an optical engine according to an embodiment of the subject technology.
FIG. 11 is a snapshot diagram of hybrid bonding of the short-loop/interposer wafer and debonding of the carrier wafer process step of the method for preparing electronic integrated circuit to build an optical engine according to an embodiment of the subject technology.

FIG. 10 is a snapshot diagram of a step of providing a short-loop/interposer wafer of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. FIG. 10 shows a process step to introduce a second silicon substrate 300 as an interposer wafer having a second frontside 301 and a second backside 302. The second silicon substrate 300 is also generally referred to as a second substrate. The second frontside 301 of the second substrate is also referred to as a third side 301. The second backside 302 is also referred to as a fourth side 302. This interposer wafer is intended for providing interposer or interconnect between different wafers or substrates. Compared to the first silicon substrate 100 as an incoming CMOS wafer (typically from foundry) with electronic circuits formed therein, the second silicon substrate 300 is a short loop wafer used in late-stage assembly process. In some embodiments, the second silicon substrate 200 is introduced for assisting backside processing of the first silicon substrate to complete a preparation of an electronic integrated circuit for stacking with a photonic integrated circuit to build an optical engine.

In a specific embodiment, the second silicon substrate is provided with its frontside 301 being preprocessed to form at least a third metal layer 340 with a second conductive contact 350 coupled on top and embedded in a third dielectric layer 345 overlying the frontside surface. Optionally, the metal layer 340 can be aluminum formed by electroplating up to a sufficiently large thickness as it is intended to serve as etch-stop layer as well as a conductor for forming an interconnect through the second silicon substrate 300. Optionally, second conductive contact 350 is provided as copper material, in particular, a hybrid bond Cu pad embedded in and flushed with a surface of the third dielectric layer 345. The third dielectric layer 345 covers the third metal layer 340 and isolates the hybrid bond Cu pad 350. Optionally, the surface of the dielectric layer 345 and the exposed second end 135B of conductive via is CMP polished. Both the Cu pad 350 and the third dielectric layer 345 serve as hybrid bonding elements between the second silicon substrate 300 and the first silicon substrate 100. Optionally, the second silicon substrate 300 mentioned above is introduced with its full thickness h0. Alternatively, the second silicon substrate 300 is introduced with its thickness h0 being thinned down to about 75 um (varied in a range of a few um) for facilitating a process for forming a through-silicon deep trench with a high aspect ratio in technically allowed range to limit a lateral dimension of the trench fitting with circuit design requirement.

FIG. 11 is a snapshot diagram of hybrid bonding of the short-loop/interposer wafer and debonding of the carrier wafer process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. As shown, the frontside (third side) 301 of the second silicon substrate 300 is flipped down to attach to the backside (second side) 102 of the first silicon substrate 100. In an embodiment, the second conductive contact 350 on the frontside 301 is aligned with the conductive material at the second end 135B of the through-silicon via interconnect 135 at the backside 102. As the frontside 301 of the second silicon substrate 300 is physically in contact with the backside 102 of the first silicon substrate 100, the third dielectric layer 345 is firstly in direct physical contact with the second dielectric layer 156. In an embodiment, two polished surfaces of third dielectric layer 345 and second dielectric layer 156 in direct contact at room temperature can result in a dielectric bonding. Additional pressure may apply to strength the dielectric bonding. In another embodiment, the second conductive contact 350 may have physically contacted with or will be in contact after annealing the two substrates at an elevated temperature (e.g., in a range of 400-500° C.) due to thermal expansion. The elevated temperature helps to facilitate diffusion and intermixing of Cu atoms from both the Cu pad 350 and the second end 135B at the contact interface to form strong metallic bonding. Annealing also helps activate the dielectric bonding process and promotes the formation of strong bonds between the oxide surfaces. In the end, the hybrid bonding process leads to the formation of a two-substrate stack of the first and second silicon substrates.

Optionally, the second silicon substrate 300 is processed from the backside (fourth side) 302 to thin down its thickness from a full thickness to about 75 um. The thinning process can be performed using the carrier substrate as a handle substrate. In other words, the thinning process of the second substrate 300 is optionally performed before a debonding process is done for the carrier substrate 200.

In another embodiment, as shown in FIG. 11, the carrier substrate 200 (e,g., a glass wafer) is debonded from the frontside 101 of the first silicon substrate 100 after the second silicon substrate 300 is hybrid bonded with the first silicon substrate 100. Laser debonding technique is used to separate the bonded materials at the interface between the carrier substrate 200 and the frontside of the first silicon substrate 100 by selectively heating and weakening the bonding interface using laser energy. Particularly, laser pulse is applied to the glue material 145 (see FIG. 9) or the adhesive layer in a controlled manner, leading to localized heating and softening or weakening of the bond. The process is carefully optimized to ensure efficient wafer debonding while minimizing any damage or residual stress on the conductive contact 140 at the frontside 101 of the first silicon substrate 100. Once the bond strength is sufficiently weakened, the bonded glue materials 145 can be separated from the frontside 101 by applying gentle mechanical force or other separation techniques. After separation, any residue from the adhesive or glue material may need to be cleaned or removed from the surface at the frontside 101. The resulted two-substrate stack has a total thickness h3, optionally in a range of 80-87 um, providing a much stronger base for executing via-last process without causing wafer warping or cracking.

Figure 12:
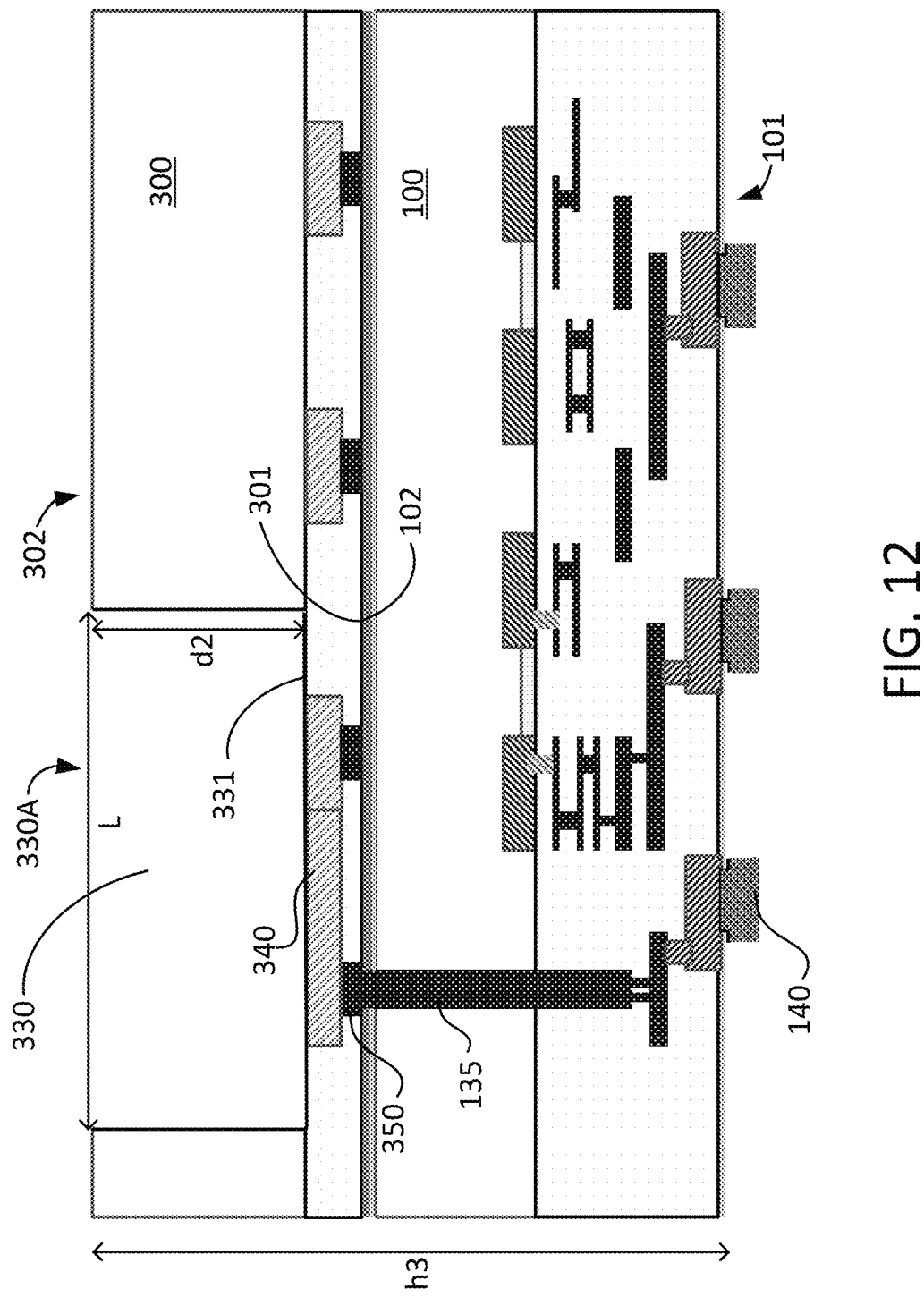
FIG. 12 is a snapshot diagram of a trench-forming process step of the method for preparing electronic integrated circuit to build an optical engine according to an embodiment of the subject technology.

FIG. 12 is a snapshot diagram of a trench-forming process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. FIG. 12 shows that a trench-forming process or essentially a via-last process is performed from the backside 302 of the second silicon substrate 300. In a specific embodiment, deep reactive ion etching (DRIE) technique is used to etch silicon from a portion 330A of the backside 302 to form a deep trench 330 of a depth d2 from the backside 302 into the second silicon substrate 300 until the etching process is stopped at bottom 331 by third metal layer 340 formed on the frontside 301. The trench 330 in principle is similar to a through-silicon via except that the lateral dimension L of the trench (i.e., the lateral dimension of the portion of the backside) can be much larger than that for a typical through-silicon via with high aspect ratio.

The aspect ratio of the trench 330 may not be stringent to avoid being too close to other circuits because the second silicon substrate 300 is essentially provided as a blanket wafer. As the second silicon substrate 300 has been thinned down from its full thickness to about 75 um, the deep trench 330 can be formed with a lateral dimension L of 60 um compared to its depth of 75 um. Additionally, the 75-um thickness makes the second silicon substrate mechanically rigid and strong enough to avoid wafer warping or cracking during the DRIE process. The large lateral dimension of the trench facilitates the subsequent passivation process and formation of redistribution layer inside the trench. Because the third metal layer 340 is formed with a large thickness at the frontside 301 of the second silicon substrate 300 (see FIG. 10), it provides enough metal material for withstanding etching metal consumption and stopping the etching process to form the deep trench 330 (or through-silicon via) in the second silicon substrate 300.

This approach solves a big problem that the lower-BEOL layer is not thick enough in some existing approaches via-last process and also solves another problem of stress-induced wafer warping and cracking due to scaling TSV aspect ratio in the thin (~10 um) CMOS wafer from the foundry based on advanced (7 nm or lower) technology node.

Figure 13:
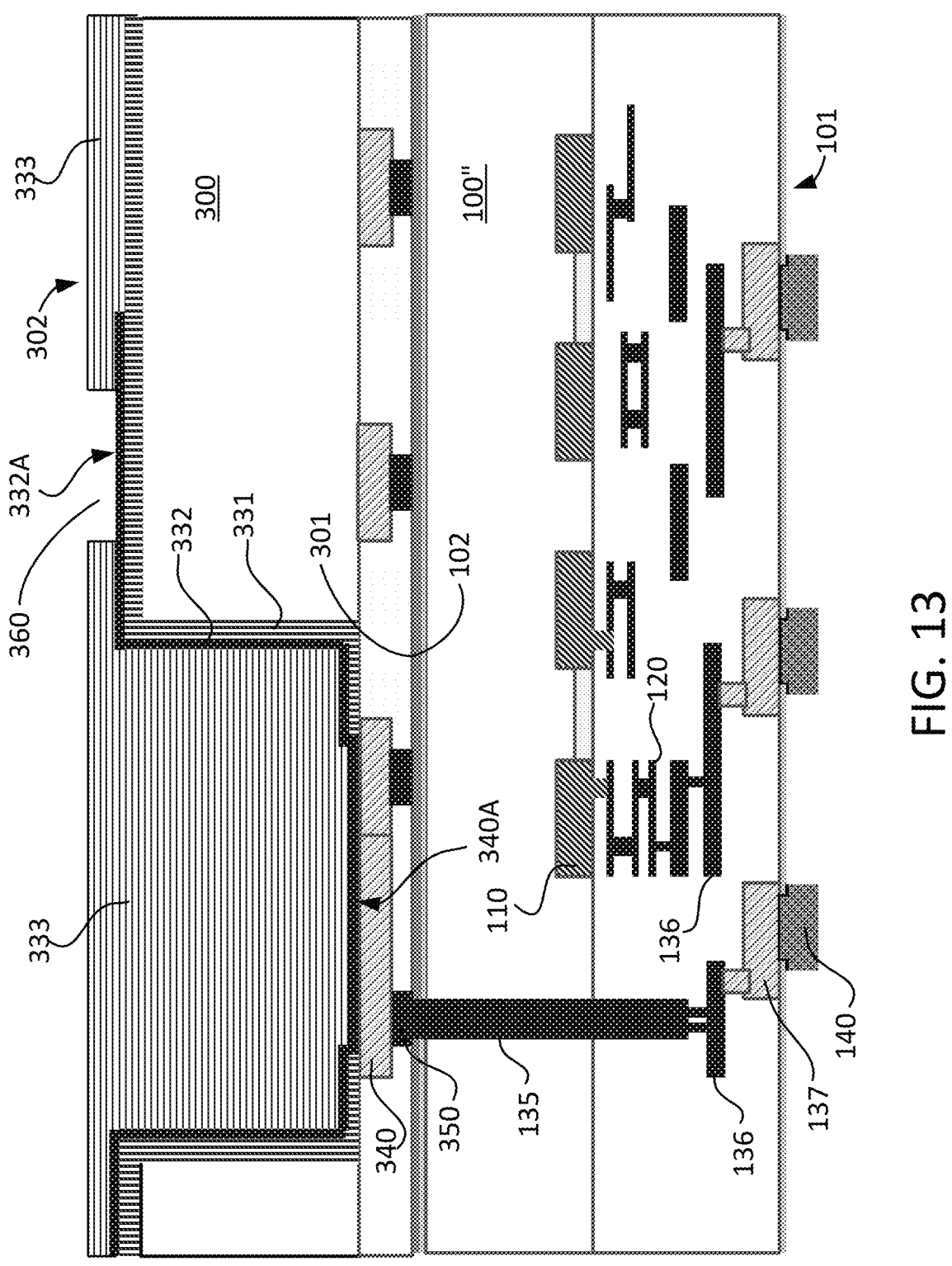
FIG. 13 is a snapshot diagram of a backside redistribution layer process step of the method for preparing electronic integrated circuit to build an optical engine according to an embodiment of the subject technology.

FIG. 13 is a snapshot diagram of a backside redistribution layer process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. FIG. 13 shows a structure of the backside redistribution layer based on the deep trench 330, which is formed through multiple steps including passivating a first polyimide layer 331 overlying entire backside 302 except the trench portion 330A (see FIG. 12) and all inner side except a portion 340A of the bottom of the trench. The bottom of the trench is in fact the third metal layer 340 formed at the frontside 301 that is now attached to the backside 102 of the first silicon substrate 100. The first polyimide layer 331 is an organic with excellent dielectric properties, thermal stability, and chemical resistance. It can be applied with uniform coating over complex or uneven surfaces using various techniques such as spin coating, spray coating, or chemical vapor deposition (CVD). In this embodiment, the first polyimide layer 331 can be 20 um in thickness. Trench bottom portion 340A can be initially masked off then the mask can be lifted later.

FIG. 13 also shows that a fourth metal layer 332 subsequently coats over the first polyimide layer 331 along the sidewalls of the trench and the backside surface other than the trench portion. The fourth metal layer 332 also coats over the trench bottom portion 340A to couple with the third metal layer 340. In an embodiment, the fourth metal layer 332 is Cu applied by electroplating and serves as an electrical redistribution layer to connect the electronic circuits in frontside 101 of the first silicon substrate 100 through the third metal layer 340, second conductive contact 350, conductive interconnect 135, first metal layer 136, and metal routing layers 120. The fourth metal layer 332 is also laid along the sidewall of the trench to extend over the backside 302. Additionally, as shown in FIG. 13, a second polyimide layer 333 is applied to fill the trench and overlay the fourth metal layer 332 except a selected portion 332A thereof on the backside 302 or any exposed portion of the first polyimide layer 331 on the backside 302. The second polyimide layer 333 also planarizes the backside 302 at the end of the passivation process. Optionally, the selected portion 332A of the fourth metal layer 332 may be exposed secondly by etching the polyimide material away to form a cavity 360 after the entire surface of the fourth metal layer 332 is covered firstly by the second polyimide layer 333.

In another embodiment, forming the trench as shown in FIG. 12 by etching is combined with applying a (first) passivation layer to the inner side of the trench as shown in FIG. 13 in a cyclic etching/passivation process. For the etching step, a reactive gas is introduced, and plasma is generated using a radio frequency (RF) power source to induce chemical reaction between the gas and the silicon, creating volatile residue gas that is pumped out. This step removes a certain amount of silicon from the portion of the second backside 302 by etching to form a trench with an initial depth. For the passivation step, a polyimide gas is introduced and deposits a thin layer of polymer on the trench sidewalls and mask, protecting them from further etching. This polyimide layer prevents lateral etching and allows the trench to go deeper. The etching and passivation steps are repeated cyclically until the desired trench depth is achieved. Each cycle typically removes a specific depth of silicon, allowing for precise control over the trench depth. Once the etching reaches the metal stop layer, i.e., the third metal layer 340, the metal acts as an etch stop. The metal stop layer, which can be aluminum (Al), tantalum (Ta), or other suitable metals, prevents further etching into the substrate once reached (the second) depth d2 as shown in FIG. 12.

Figure 14:
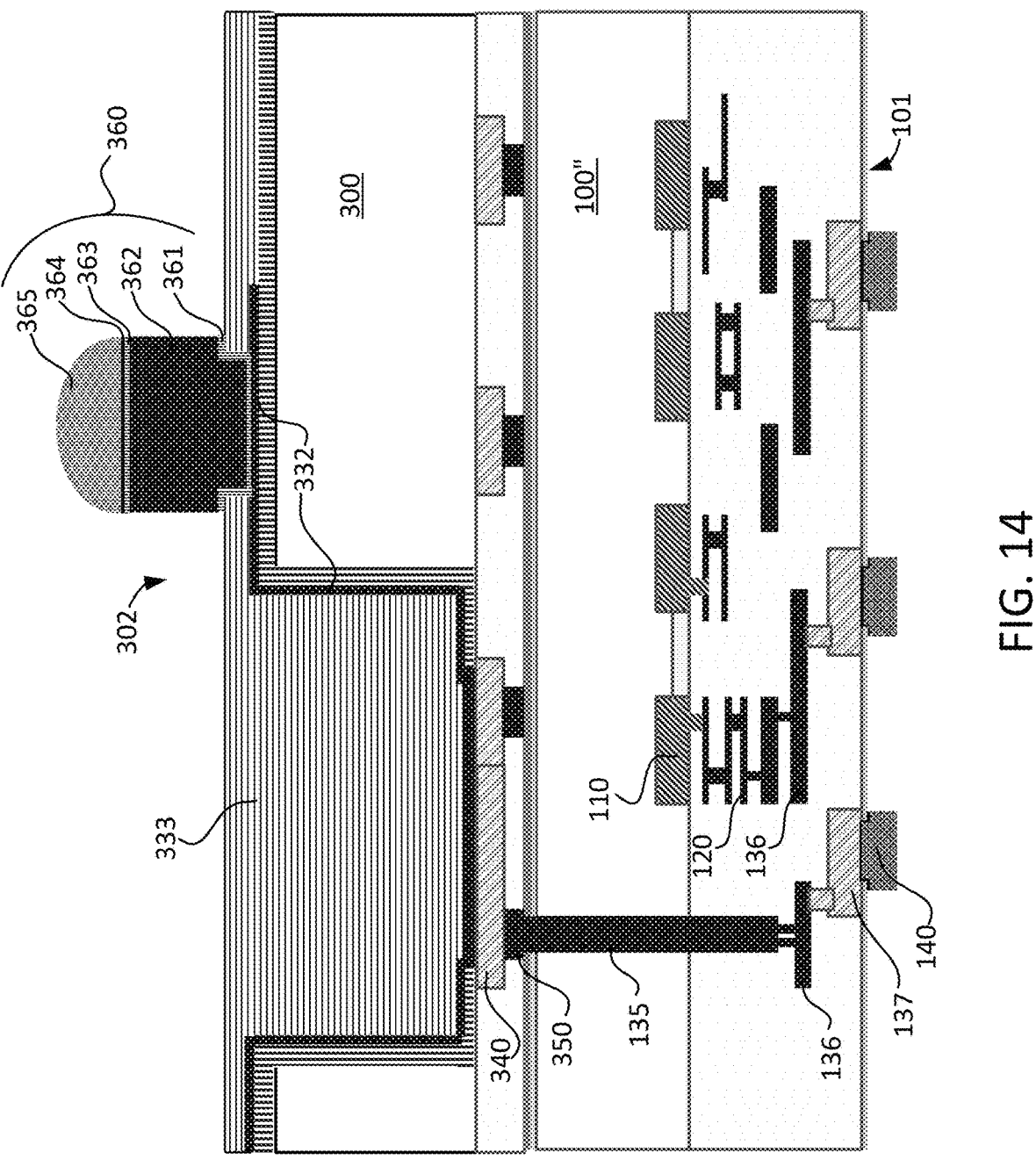
FIG. 14 is a snapshot diagram of a backside contact formation process step of the method for preparing electronic integrated circuit to build an optical engine according to an embodiment of the subject technology.

FIG. 14 is a snapshot diagram of a backside contact formation process step of the method for preparing electronic integrated circuit to build an optical engine according to an embodiment of the subject technology. This diagram is merely an example, which should not unduly limit the scope of the claims. One of ordinary skill in the art would recognize many variations, alternatives, and modifications. FIG. 14 shows a third conductive contact 360 formed at the second backside 302 of the second silicon substrate 300. Essentially, the third conductive contact 360 serves as the backside contact for the electronic integrated circuit (EIC) in the two-substrate stack, which will be used for bonding a photonic integrate circuit (PIC) on top.

Following the formation of the exposed portion 332A of the fourth metal layer 332 (see FIG. 13), a seed layer 361 can be deposited first overlying the exposed portion 332A plus some sidewall region and upper edge region of the cavity 360. Then a metal electroplating process is performed to form a metal pillar 362 on seed layer 361. In an example, the metal pillar comprises Cu material and is characterized by a shape with a height being equal to or larger than a width, a design for serving as interconnects within a device or package. Copper pillars enable high-density interconnectivity and are prevalent in advanced packaging technologies. Furthermore, a barrier layer 363 is formed overlying the top surface of metal pillar 362 to serve as a diffusion barrier for the metal in the metal pillar 362. Optionally, barrier layer 363 comprises Ni as a good diffusion barrier for Cu in the metal pillar 362. On top of the barrier layer 363 a surface protection layer 364 is formed, providing protection against oxidation and corrosion. Optionally, the protection layer comprises gold. Additionally, a solder bump 365 may be added on top of the surface protection layer 364 to complete the third conductive contact 360 at the backside of the EIC two-substrate stack. FIG. 14 shows that the third conductive contact 360 is electrically coupled to the electronic circuits 110 of the EIC two-substrate stack. The third conductive contact 360 is ready for bonding with a corresponding contact of a PIC chip.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. An integrated circuit comprising:
a first substrate comprising a first side and a second side;
a circuit disposed on the first side;
a first dielectric layer positioned on the circuit, the first dielectric layer comprising a first surface;
a second dielectric layer positioned on the second side, the second dielectric layer comprising a second surface;
a first metal layer embedded in the first dielectric layer, the first metal layer being coupled to the circuit;
a second metal layer positioned on the first surface, the second metal layer being coupled to the first metal layer;
a first contact coupled to the second metal layer;
a via comprising a first end and a second end, the first end being coupled to the first metal layer and a second end being positioned on the second surface and coupled to the second dielectric layer;
a second substrate comprising a third, a fourth side, and a trench, the trench comprising a sidewall and a bottom;
a third dielectric layer positioned on the third side, the third dielectric layer comprising a third surface;
a third metal layer positioned on the third dielectric layer;
a second contact coupled to the third metal layer and positioned on the third surface, the second contact being coupled to the second end of the via, the second surface being contacted with the third surface;

a fourth metal layer positioned on the fourth side and on the sidewall to couple to the third metal layer at the bottom; and a third contact coupled to the fourth metal layer.

2. The integrated circuit of claim 1, wherein the first contact comprises a metal bump configured to couple to an electrical contact on a printed circuit board.

3. The integrated circuit of claim 1, wherein the first substrate comprises a silicon wafer with a first thickness in a range of 10 to 12 um.

4. The integrated circuit of claim 1, wherein the second substrate comprises a silicon wafer with a second thickness of 75 um or greater.

5. The integrated circuit of claim 1, wherein the second contact comprises a metal pad.

6. The integrated circuit of claim 5, comprising a two-substrate stack formed by dielectric bonding between the second dielectric layer and the third dielectric layer and metal bonding between the metal pad and the second end of the via.

7. The integrated circuit of claim 1, wherein the third contact comprises a metal pillar with a solder cap configured to couple to an electrical contact of a photonic integrated circuit on a third substrate.

* * * * *